(12) United States Patent
Lee et al.

(10) Patent No.: US 9,160,377 B2
(45) Date of Patent: Oct. 13, 2015

(54) MULTI-MODE MULTI-BAND POWER AMPLIFIERS

(71) Applicant: QUALCOMM Incorporated, San Diego, CA (US)

(72) Inventors: Chang-Ho Lee, San Diego, CA (US); Woonyun Kim, San Diego, CA (US); Minsik Ahn, San Diego, CA (US); Jeongwon Cha, San Diego, CA (US); Yunseo Park, San Diego, CA (US); Aristotele Hadjichristos, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/720,851

(22) Filed: Dec. 19, 2012

(65) Prior Publication Data
US 2015/0050901 A1  Feb. 19, 2015

(51) Int. Cl.
*H03F 1/02* (2006.01)
*H04B 1/04* (2006.01)
*H03F 3/72* (2006.01)
*H03H 7/38* (2006.01)

(52) U.S. Cl.
CPC ............ *H04B 1/0458* (2013.01); *H03F 1/0277* (2013.01); *H03F 3/72* (2013.01); *H04B 1/0483* (2013.01); *H03F 2203/7239* (2013.01); *H03H 7/38* (2013.01)

(58) Field of Classification Search
USPC .......... 455/91, 102, 103, 127.1, 127.2, 127.3, 455/127.4; 330/165, 195, 278, 295
See application file for complete search history.

(56) References Cited

U.S. PATENT DOCUMENTS

| | | | | |
|---|---|---|---|---|
| 5,909,643 | A * | 6/1999 | Aihara | 455/127.3 |
| 6,489,843 | B1 * | 12/2002 | Nishijima et al. | 330/51 |
| 6,532,357 | B1 * | 3/2003 | Ichikawa | 455/126 |
| 6,625,430 | B2 * | 9/2003 | Doherty | 455/126 |
| 7,630,693 | B2 * | 12/2009 | Liu et al. | 455/127.1 |
| 7,944,296 | B1 | 5/2011 | Lee et al. | |
| 7,952,433 | B2 | 5/2011 | An et al. | |
| 8,130,043 | B2 | 3/2012 | Arell | |
| 8,149,050 | B2 | 4/2012 | Cabanillas | |
| 8,280,325 | B2 | 10/2012 | Zolfaghari | |
| 2010/0248660 | A1 * | 9/2010 | Bavisi et al. | 455/120 |

FOREIGN PATENT DOCUMENTS

| | | |
|---|---|---|
| DE | 10361660 A1 | 2/2005 |
| WO | 2011017368 | 2/2011 |
| WO | 2011060323 A1 | 5/2011 |

OTHER PUBLICATIONS

International Search Report and Written Opinion—PCT/US2013/076749—ISA/EPO—Apr. 15, 2014.

* cited by examiner

*Primary Examiner* — Blane J Jackson
(74) *Attorney, Agent, or Firm* — Ramin Mobarhan (57) ABSTRACT

Exemplary embodiments are directed to an amplifier module which may comprise a transmit path including a first amplifier and a second amplifier. The exemplary amplifier module may further include a transformer coupled between the first amplifier and the second amplifier and switchably configured for coupling the first amplifier in series with the second amplifier in a first mode and coupling the first amplifier to bypass the second amplifier in a second mode.

20 Claims, 8 Drawing Sheets

MULTI-MODE MULTI-BAND POWER AMPLIFIERS

BACKGROUND

1. Field

The present invention relates generally to power amplifiers. More specifically, the present invention relates to methods, systems, and devices for multi-mode, multi-band power amplifiers.

2. Background

In a wireless communication system, a transmitter may process (e.g., encode and modulate) data to generate output samples. The transmitter may further condition (e.g., convert to analog, filter, frequency up-convert, and amplify) the output samples to generate an output radio frequency (RF) signal. The transmitter may then transmit the output RF signal via a wireless channel to a receiver. The receiver may receive the transmitted RF signal and perform the complementary processing on the received RF signal. The receiver may condition (e.g., amplify, frequency down-convert, filter, and digitize) the received RF signal to obtain input samples. The receiver may further process (e.g., demodulate and decode) the input samples to recover the transmitted data.

The transmitter may support multiple modes and multiple frequency bands. Each mode may correspond to a different radio technology, and each frequency band may cover a different range of frequencies. The transmitter may include a number of power amplifiers to support the multiple modes and the multiple bands. For example, each power amplifier may support a specific mode on a specific band. A relatively large number of power amplifiers may then be required for the transmitter, which may increase size and cost of the transmitter.

A need exists for an enhanced multi-mode, multi-band power amplifier. More specifically, a need exists for increasing power added efficiency and decreasing insertion loss of a multi-mode, multi-band power amplifier.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

A multi-mode multi-band power amplifier (PA) module capable of supporting multiple modes and multiple frequency bands is described herein. The PA module may be used for various electronics devices such as wireless communication devices, cellular phones, personal digital assistants (PDAs), handheld devices, wireless modems, laptop computers, cordless phones, Bluetooth devices, consumer electronics devices, etc. For clarity, the use of the PA module in a wireless communication device is described below.

Exemplary embodiments, as described herein, are directed to an enhanced multi-mode, multi-band power amplifier module. According to one exemplary embodiment, an amplifier module may include a transmit path including a first amplifier and a second amplifier. The amplifier module may also include a transformer coupled between the first amplifier and the second amplifier and switchably configured for coupling the first amplifier in series with the second amplifier in a first mode and coupling the first amplifier to bypass the second amplifier in a second mode.

Figure 1:
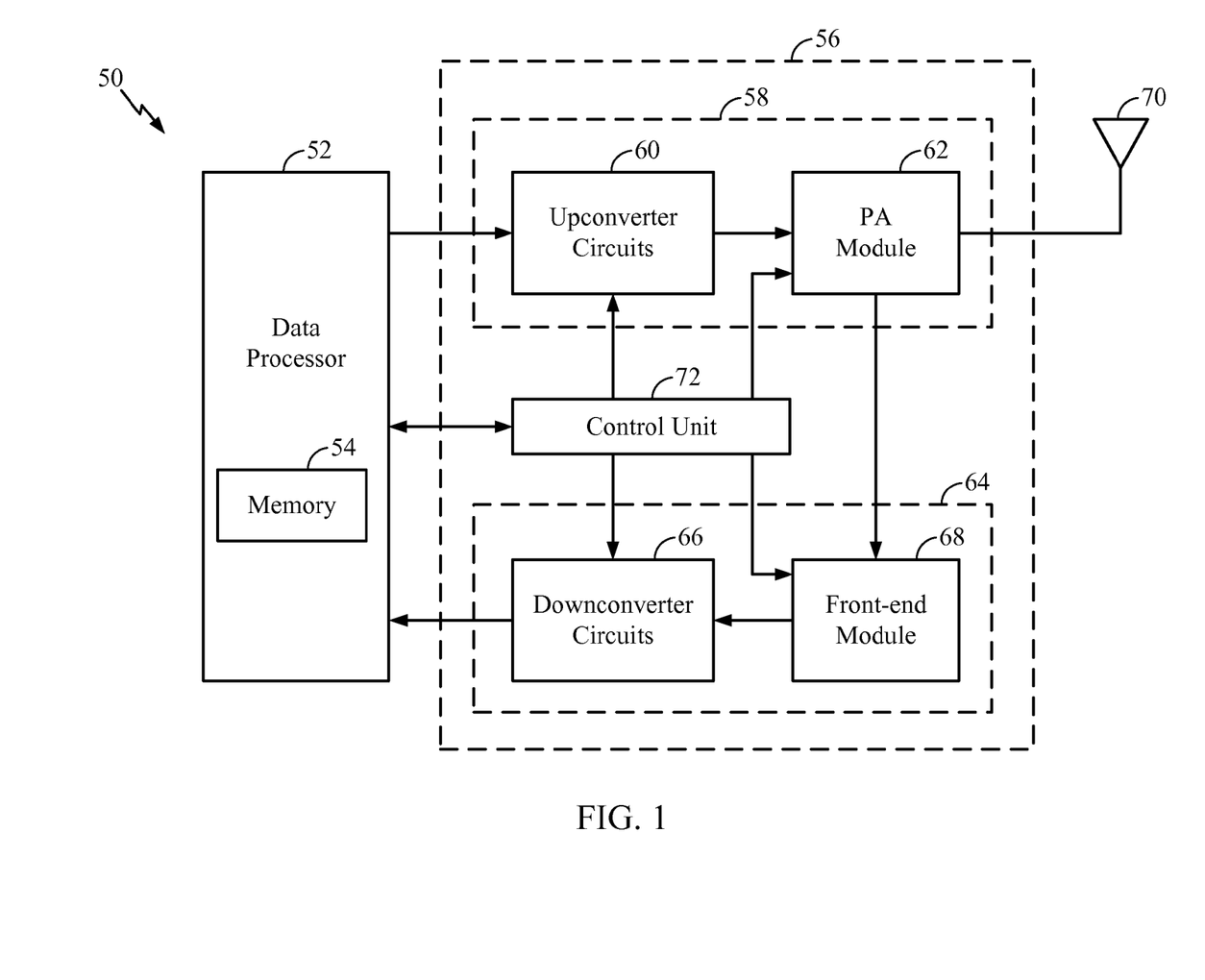
FIG. 1 is a block diagram of a wireless communication device, according to an exemplary embodiment of the present invention.

FIG. 1 shows a block diagram of an exemplary design of a wireless communication device 50. In this exemplary embodiment, wireless device 50 includes a data processor 52 and a transceiver 56. Transceiver 56 includes a transmitter 58 comprising up-converter circuits 60 and a PA module 62. Transceiver 56 further includes a receiver 64 comprising a front-end module 68 and down-converter circuits 66. In general, wireless device 50 may include any number of transmitters and any number of receivers for any number of communication systems and any number of frequency bands.

In the transmit path, data processor 52 may process data to be transmitted and provide an output baseband signal to transmitter 58. Within transmitter 58, up-converter circuits 60 may process (e.g., amplify, filter, and frequency up-convert) the output baseband signal and provide an input RF signal. Up-converter circuits 60 may include amplifiers, filters, mixers, etc. PA module 62 may amplify the input RF signal to obtain the desired output power level and provide an output RF signal, which may be transmitted via an antenna 70. PA module 62 may include driver amplifiers, power amplifiers, switches, etc., as described below.

In the receive path, antenna 70 may receive RF signals transmitted by base stations and/or other transmitter stations and may provide a received RF signal, which may be routed via PA module 62 and provided to receiver 64. Within receiver 64, front-end module 68 may process (e.g., amplify and filter) the received RF signal and provide an amplified RF signal. Front-end module 68 may include duplexers, low noise amplifiers (LNA), etc. Down-converter circuits 66 may further process (e.g., frequency down-convert, filter, and amplify) the amplified RF signal and provide an input baseband signal to data processor 52. Down-converter circuits 66 may include mixers, filters, amplifiers, etc. Data processor 52 may further process (e.g., digitize, demodulate, and decode) the input baseband signal to recover transmitted data.

A control unit 72 may receive control information from data processor 52 and may generate controls for the circuits and modules in transmitter 58 and receiver 64. Data processor 52 may also provide controls directly to the circuits and modules in transmitter 58 and receiver 64. In any case, the controls may direct the operation of the circuits and modules to obtain the desired performance.

FIG. 1 shows an exemplary design of transmitter 58 and receiver 64. In general, the conditioning of the signals in transmitter 58 and receiver 64 may be performed by one or more stages of amplifiers, filters, mixers, etc. These circuit blocks may be arranged in various configurations. All or a portion of transmitter 58 and all or a portion of receiver 64 may be implemented on one or more analog integrated circuits (ICs), one or more RF ICs (RFICs), one or more mixed-signal ICs, etc. For example, PA module 62 may be implemented on one RFIC, and up-converter circuits 60 and down-converter circuits 66 may be implemented on another RFIC.

Data processor 52 may perform various functions for wireless device 50, e.g., processing for data being transmitted or received. A memory 54 may store program codes and data for data processor 52. Data processor 52 may be implemented on one or more application specific integrated circuits (ASICs) and/or other ICs.

Wireless device 50 may support multiple modes and multiple bands. PA module 62 may be designed to support all of the modes and bands supported by wireless device 50. The multiple modes may correspond to different radio technologies such as Code Division Multiple Access (CDMA) 1X, Wideband CDMA (WCDMA), Global System for Mobile Communications (GSM), Long Term Evolution (LTE), Wireless Local Area Network (WLAN), etc. Each mode may correspond to a particular radio technology, which may utilize frequency division duplexing (FDD) or time division duplexing (TDD). For FDD, different frequency channels are used for the downlink and uplink, and a duplexer may be used to route an output RF signal from a transmitter to an antenna and to route a received RF signal from the antenna to a receiver. For TDD, the same frequency channel is used for both the downlink and uplink, and a switch may be used to couple the transmitter to the antenna some of the time and to couple the receiver to the antenna some other time.

Figure 2:
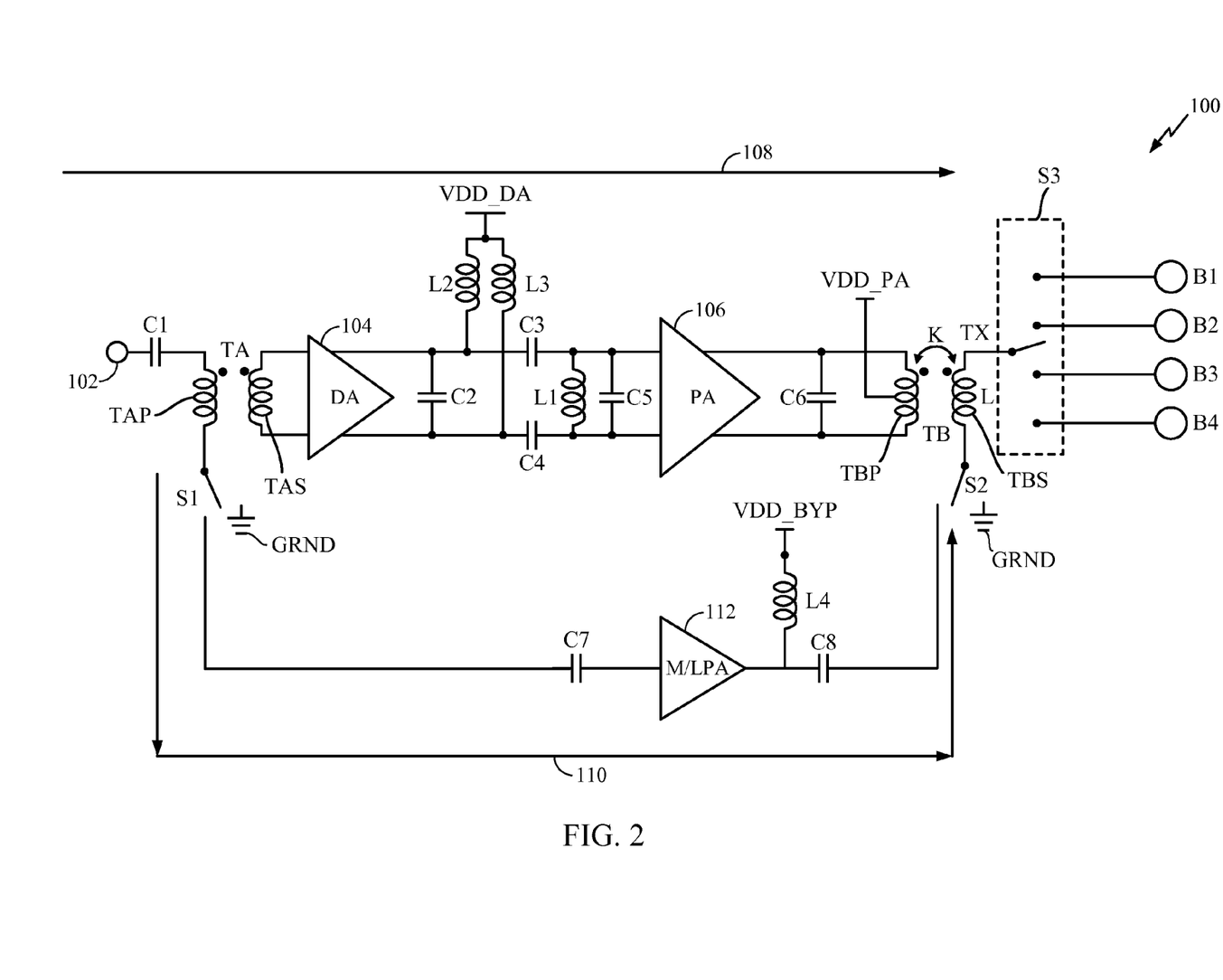
FIG. 2 illustrates a power amplifier module including a plurality of transmit paths.

FIG. 2 illustrates a power amplifier module 100. Power amplifier module 100 includes a single-ended input 102 coupled to a first end of a primary winding TAP of a transformer TA via a capacitor C1. A second end of primary winding TAP of a transformer TA is coupled to a switch 51. A secondary winding TAS of transformer TA is coupled to an input of a driver amplifier 104. Power amplifier module 100 further includes a capacitors C2-C5 and inductors L1-L3. In addition, power amplifier module 100 includes a power amplifier 106 coupled between capacitor C5 and a capacitor C6. Moreover, power amplifier module 100 includes another transformer TB having a primary winding TBP coupled to capacitor C6 and a second winding TBS coupled to each of a switch S2 and a switch S3. Power amplifier module 100 also includes an amplifier 112 coupled between capacitors C7 and C8, and an inductor L4 coupled between an output of amplifier 112 and a supply voltage $V_{DD\_BYP}$.

Switch S1 of power amplifier module 100 is configured to couple the second end of primary winding TAP of transformer TA to either a ground voltage GRND or capacitor C7. Further, switch S2 is of power amplifier module 100 is configured to couple one end of secondary winding TBS of transformer TB to either ground voltage GRND or capacitor C8. Moreover, switch S3 of power amplifier module 100 is configured to couple another end of secondary winding TBS of transformer TB to one of a plurality of ports B1-B4 for selecting a desired frequency band.

During a contemplated operation of power amplifier module 100 (i.e., a high-power mode), switch S1 and switch S2 are coupled to ground voltage GRND, and therefore, a signal received at input 102 is conveyed through driver amplifier 104 and power amplifier 106 to one of ports B1-B4, depending on a selected frequency band. A high-power path is depicted by arrow 108. During another contemplated operation of power amplifier module 100 (i.e., either a medium-power mode or a low-power mode), switch S1 is coupled to capacitor C7 and switch S2 is coupled to capacitor C8 and, therefore, a signal received at input 102 bypasses driver amplifier 104 and power amplifier 106, and is conveyed through amplifier 112 to one of ports B1-B4, depending on a selected frequency band. Medium and low-power paths are depicted by arrow 110.

As will be appreciated by a person having ordinary skill in the art, conventional power amplifier architectures may suffer from lower performance as the number of required frequency bands increases. Further, conventional power amplifier architectures may include a first path for high-power operation and a second path, which is used for both medium and low-power modes. However, because the second path supports both medium and low-power modes, neither low-power nor medium-power modes may be optimized. Stated another way, in order to support both medium and low-power modes, the second path includes a trade-off between low-power mode PAE and the output power of the medium-power mode. In addition, multi-port switches of conventional power amplifier architectures (e.g., switch S3 of power amplifier module 100) may have a higher insertion loss as the number of required frequency bands increases.

Figure 3:
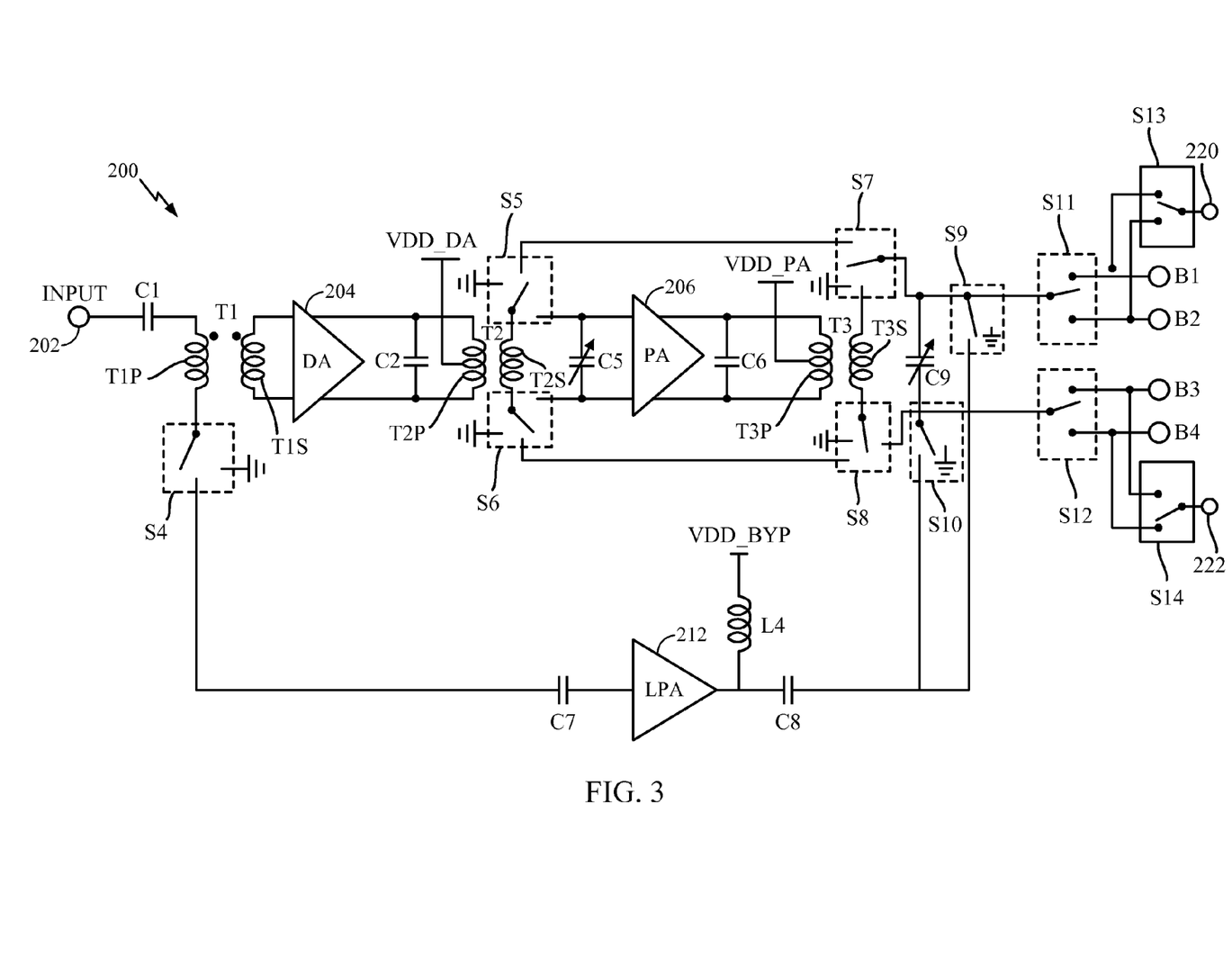
FIG. 3 illustrates another power amplifier module configured for operating in one of a plurality of operating modes and one of a plurality of bands, in accordance with an exemplary embodiment of the present invention.

FIG. 3 illustrates power amplifier module 200, according to an exemplary embodiment of the present invention. Power amplifier module 200 includes an input 202 coupled to a first end of primary winding T1P of a transformer T1 via capacitor C1. A second end of primary winding T1P of a transformer T1 is coupled to a switch S4. Further a secondary winding T1S of transformer T1 is coupled to a driver amplifier 204. It is noted that primary winding T1P of a transformer T1 is configured to receive a single-ended signal from input 202 and secondary winding T1S of transformer T1 is configured to convey a double-ended signal to driver amplifier 204. Power amplifier module 200 further includes capacitor C2 coupled in parallel with each of an output of driver amplifier 204 and a primary winding T2P of a transformer T2. In addition, a center tap of primary winding T2P of transformer T2 is coupled to a supply voltage VDD_DA.

Power amplifier module 200 also includes capacitors C5 and C6, a power amplifier 206, a transformer T3, and switches S5-S8. As illustrated, a first end of secondary winding T2S of transformer T2 is switchably coupled to either an input of a power amplifier 206 via switch S5 or a secondary winding T3S transformer T3 via switch S5 and switch S7. Further, a second end of secondary winding T2S of transformer T2 is switchably coupled to either an input of a power amplifier 206 via switch S6 or a secondary winding T3S transformer T3 via switch S6 and switch S8. It is noted that switch S5 may couple secondary winding T2S of transformer T2 to either power amplifier 206, switch S7, or ground voltage GRND. Further, switch S6 may couple secondary winding T2S of transformer T2 to either power amplifier 206, switch S8, or ground voltage GRND. Additionally, an output of power amplifier 206 is coupled in parallel with capacitor C6 and a primary winding T3P of transformer T3. Furthermore, a center tap of primary winding T3P of transformer T3 is coupled to a supply voltage VDD_PA.

Power amplifier module 200 further includes capacitors C7-C9, amplifier 212, inductor L4, and switches S9-S11. As an example, amplifier 212 may comprise a low-power amplifier. As depicted, switch S4 is configured to couple the second end of primary winding T1P of transformer T1 to either a ground voltage or capacitor C7, which is coupled to an input of amplifier 212. Moreover, an output of amplifier 212 is coupled to capacitor C8, which is further coupled to a supply voltage VDD_BYP via inductor L4. Switch S9 is configured to couple an output of amplifier 112 to switch S11 and switch S10 is configured to couple the output of amplifier 112 to switch S12. Power amplifier module 200 further includes a switch S13 for coupling a receiver port 220 to either band port B1 or band port B2, and a switch S14 for coupling a receiver port 222 to either band port B3 or band port B4.

According to various exemplary embodiments of the present invention, power amplifier module 200 may be configured to operate in one a plurality of modes and in one of a plurality of bands. As described more fully with respect to FIGS. 4-6, during a high-power mode, power amplifier module 200 may be configured to convey a signal received via input 102 to one of a plurality of band ports (i.e., one of frequency band ports B1-B4) via driver amplifier 204 and power amplifier 203. Moreover, during a medium-power mode, power amplifier module 200 may be configured to convey a signal received via input 102 to one of a plurality of band ports (i.e., one of frequency band ports B1-B4) via driver amplifier 204. Further, during a low-power mode, power amplifier module 200 may be configured to convey a signal received via input 102 to one of a plurality of band ports (i.e., one of frequency band ports B1-B4) via amplifier 212.

Figure 4:
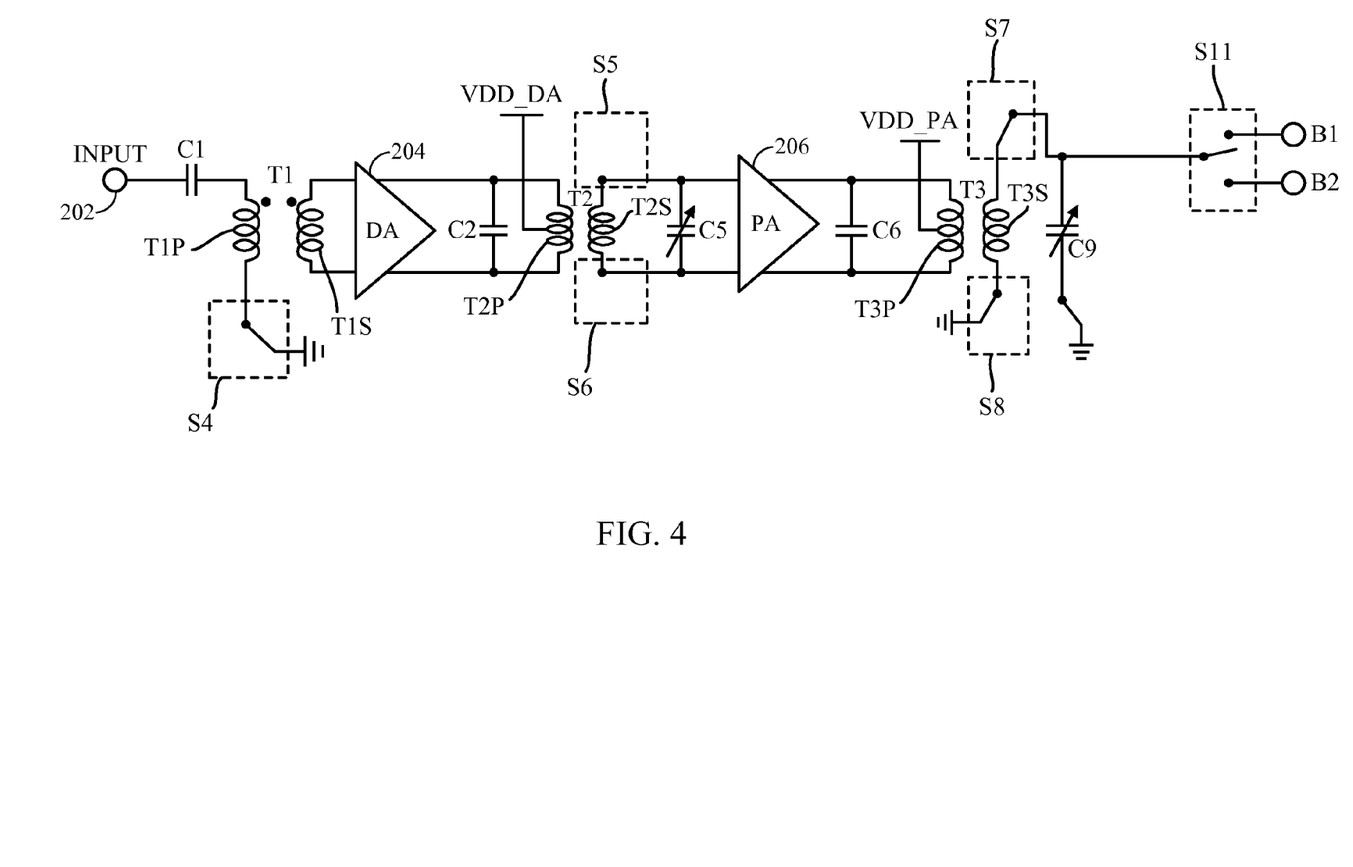
FIG. 4 illustrates the power amplifier module of FIG. 3 during operation in a high-power mode.

FIG. 4 illustrates power amplifier module 200 configured for operation in a high-power mode. It is noted that in the high-power mode configuration illustrated in FIG. 4, switch S4 couples one end of primary winding T1P of transformer T1 to ground voltage GRND, switches S5 and S6 couple secondary winding T2S of transformer T2 to power amplifier 206, switch S8 couples one end of secondary winding T3S of transformer T3 to ground voltage GRND, and switch S7 couples another end of secondary winding T3S of transformer T3 to switch S11, which is configured for selecting either a first band port B1 or a second band port B2.

A contemplated operation of power amplifier module 200 in a high-power mode will now be described. Upon receipt of a signal at input 202, power amplifier module 200 may convey a single-ended signal to primary winding T1P of transformer T1. Via inductive coupling, as will be appreciated by a person having ordinary skill in the art, a voltage may be induced in secondary winding T1S of transformer T1 and a double-ended signal may be conveyed to driver amplifier 104. After being amplified by driver amplifier 204, the double-ended signal may be conveyed to transformer T2, which may convey the signal to power amplifier 206. It is noted that transformer T2, which is switchably configured to coupled driver amplifier 204 to power amplifier 206, may provide impedance matching for power amplifier 206. Furthermore, capacitor C5 may be tunable as an interstage matching component, and capacitor C9 may be tunable as an output matching component for band tuning. Accordingly, exemplary embodiments of the present invention include transformer-based impedance matching. Power amplifier 206 may amplify the signal and convey a double-ended output that is received by primary winding T3P of transformer T3. Moreover, secondary winding T3S of transformer T3 may convey a single-ended signal to switch S11, which, as noted above, may be configured to select either first band port B1 or second band port B2.

Although power amplifier module 200 is illustrated in FIG. 4 as being configured for operation in either a first frequency band (i.e., via band port B1) or a second frequency band (i.e., via band port B2), the invention is not so limited. Rather, power amplifier module 200 may be configured for operation in one of any number of bands. For example, with reference to FIG. 3, in a different configuration, which may enable power amplifier module 200 to operate in a high-power mode and in either a third band (i.e., via third band port B3) or a fourth band (i.e., via fourth band port B4), switch S4 couples one end of primary winding of primary winding T1P of transformer T1 to ground voltage GRND, switches S5 and S6 couple secondary winding T2S of transformer T2 to power amplifier 206, switch S7 couples one end of secondary winding T3S of transformer T3 to ground voltage GRND, and switch S8 couples another end of secondary winding T3S of transformer T3 to switch S12, which is configured for selecting either third band port B3 or fourth band port B4.

Figure 5:
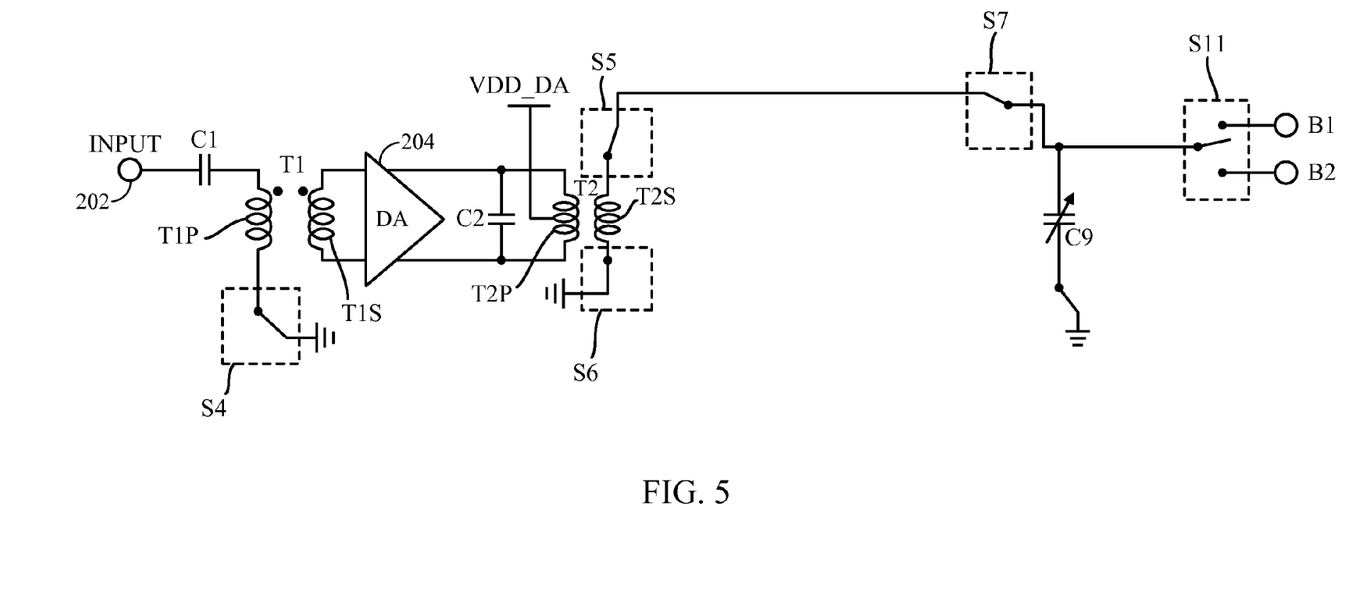
FIG. 5 illustrates the power amplifier module of FIG. 3 during operation in a medium-power mode.

FIG. 5 illustrates power amplifier module 200 configured for operation in a medium-power mode. It is noted in the medium-power mode configuration illustrated in FIG. 5, switch S4 couples one end of primary winding of primary winding T1P of transformer T1 to ground voltage GRND, switch S6 couples one end of secondary winding T2S of transformer T2 to ground voltage GRND, and switches S5 and S7 couple another end of secondary winding T2S of transformer T2 to switch S11, which is configured for selecting either a first band port B1 or a second band port B2.

A contemplated operation of power amplifier module 200 in a medium-power mode will now be described. Upon receipt of a signal at input 202, power amplifier module 200 may convey a single-ended signal to primary winding T1P of transformer T1. Via inductive coupling, as will be appreciated by a person having ordinary skill in the art, a voltage may be induced in secondary winding T1S of transformer T1 and a double-ended signal may be conveyed to driver amplifier 204. After being amplified by driver amplifier 204, the double-ended signal may be conveyed to transformer T2, which may convey a single-ended signal to switch S11, which, as noted above, may be configured to select either first band port B1 or second band port B2. With reference to FIGS. 3 and 4, it is noted that, in medium-power mode, transformer T2 is switchably configured to bypass power amplifier 206.

Although power amplifier module 200 is illustrated in FIG. 5 as being configured for operation in either a first band (i.e., via band port B1) or a second band (i.e., via band port B2), the invention is not so limited. Rather, power amplifier module 200 may be configured for operation in one of any number of bands. For example, with reference to FIG. 3, in a different configuration, which may enable power amplifier module 200 to operate in a medium-power mode and in either a third band (i.e., third band port B3) or a fourth band (i.e., via fourth band port B4), switch S4 couples one end of primary winding of primary winding T1P of transformer T1 to ground voltage GRND, switch S5 couples one end of secondary winding T2S of transformer T2 to ground voltage GRND, and switches S6 and S8 couple another end of secondary winding T2S of transformer T2 to switch S12, which is configured for selecting either third band port B3 or fourth band port B4.

Figure 6:
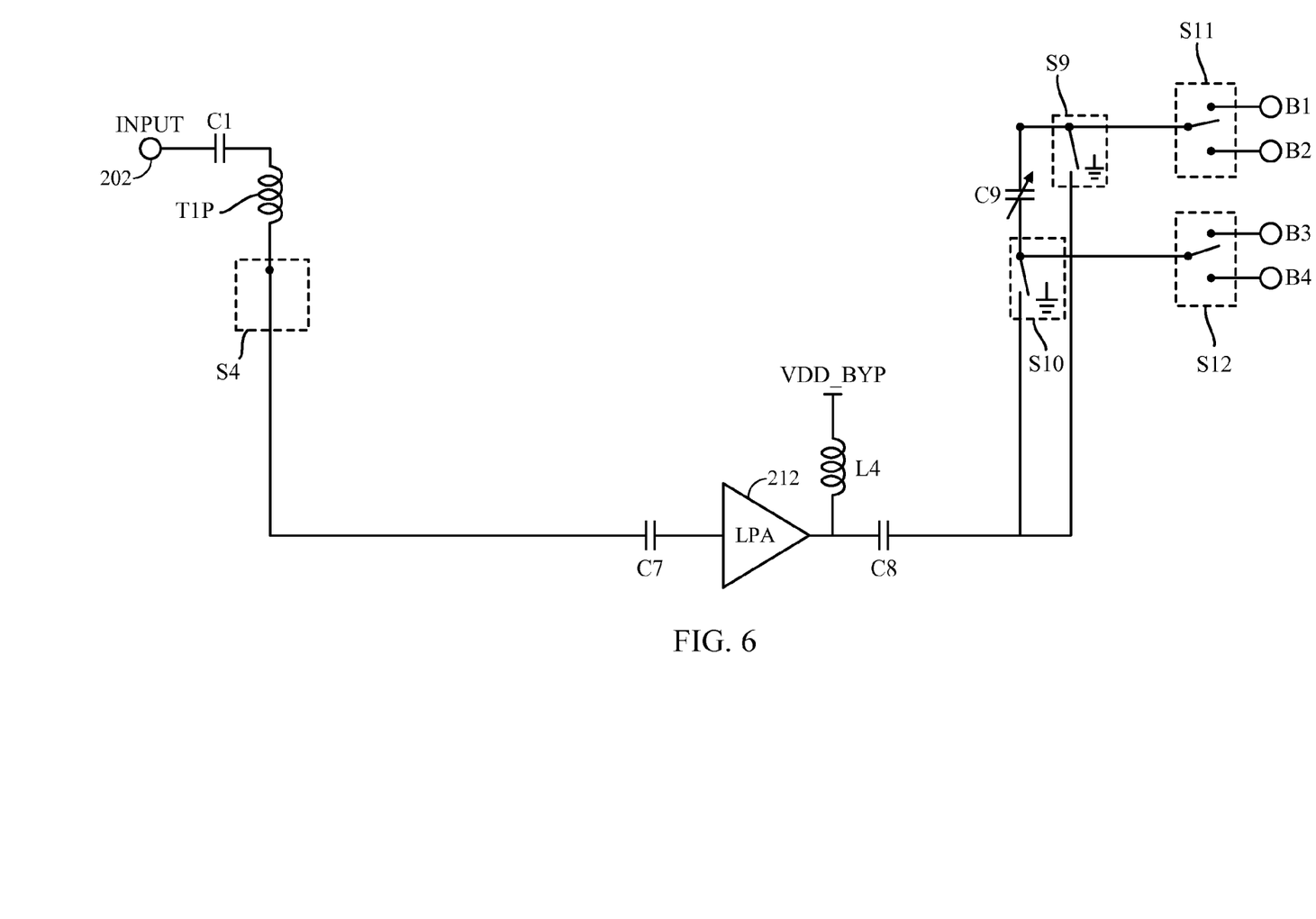
FIG. 6 illustrates the power amplifier module of FIG. 3 during operation in a low-power mode.

FIG. 6 illustrates power amplifier module 200 configured for operation in a low-power mode. It is noted that in the low-power mode configuration illustrated in FIG. 5, switch S4 couples one end of primary winding of primary winding T1P of transformer T1 to amplifier 212 (i.e., via capacitor C7). Further, switches S9-S12 may be configured for coupling an output of amplifier 212 to one of a plurality of band ports B1-B4.

A contemplated operation of power amplifier module 200 in a low-power mode will now be described. Upon receipt of a signal at input 202, power amplifier module 200 may convey a single-ended signal to amplifier 212 via primary winding T1P of transformer T1 and capacitor C7. After being amplified by amplifier 212, the signal may be conveyed to switches S10 and S9. In one configuration (i.e., if either a first band port B1 or a second band port B2 is selected), switch S10 may be coupled to ground voltage GRND and switch S9 may couple the output of amplifier 212 to switch S11, which, may be configured to select either first band port B1 or second band port B2. In another configuration (i.e., if either a third band port B3 or a fourth band port B4 is selected), switch S9 may be coupled to ground voltage GRND and switch S10 may couple the output of amplifier 212 to switch S12, which may be configured to select either third band port B3 or fourth band port B4.

The exemplary embodiments of the present invention provide for dedicated transmit paths for each of high, medium, and low-power modes. Accordingly, each path may be optimized accordingly. Further, exemplary embodiments provide for inter-stage impedance matching based on a switchable transformer, which may result in wider bandwidth without adding any devices. Therefore, the output power can be easily tuned to meet long term evolution (LTE) requirements without hurting low-power mode performance. Additionally, exemplary embodiments include multi-port transmitter switch devices (i.e., switches S11 and S12), which can be split into two output ports of a transformer (i.e., transformer T2 or T3), thus resulting in the substantial reduction of insertion loss compared to conventional amplifier switches. It is noted that receiver switch ports 220 and 222 can be either combined together or split into the transformer ports due to the front-end requirements, which also enhance the receiver path loss.

Each of the high, medium, and low-power modes are implemented in a compact form factor, and, due to the balanced structure, medium and high-power modes mode may be immune to parasitic ground inductance. Additionally, the low-power mode may be optimized for a low quiescent current requirement and medium-power mode may be optimized based on an output power capability of driver amplifier 204. Further, transmit band ports are split into two branches of an output transformer (i.e., transformer T2 in medium-power mode and transformer T3 in high-power mode). Therefore, insertion loss may be reduced compared to conventional structures and, thus, PAE at high power improves substantially.

With specific reference to FIG. 3, the differential design of power amplifier 206 may reduce ground inductance and output matching network (OMN) loss due to a higher load line. Further, transformer T3 may provide output matching for multi-band support and may stabilize power combining with smaller devices. In addition, higher load line & smaller transformation ratio may minimize OMN loss. Moreover, transformer T3 may be implemented with a high Q substrate layer. Furthermore, a switchable transformer based antenna switch module (ASM) (i.e., switches S11 and S12 and either transformer T2 or transformer T3) may minimize loss. Moreover, amplifier 212, which is configured for single-ended operation, may minimize quiescent current and may only require a relatively small area.

Figure 7:
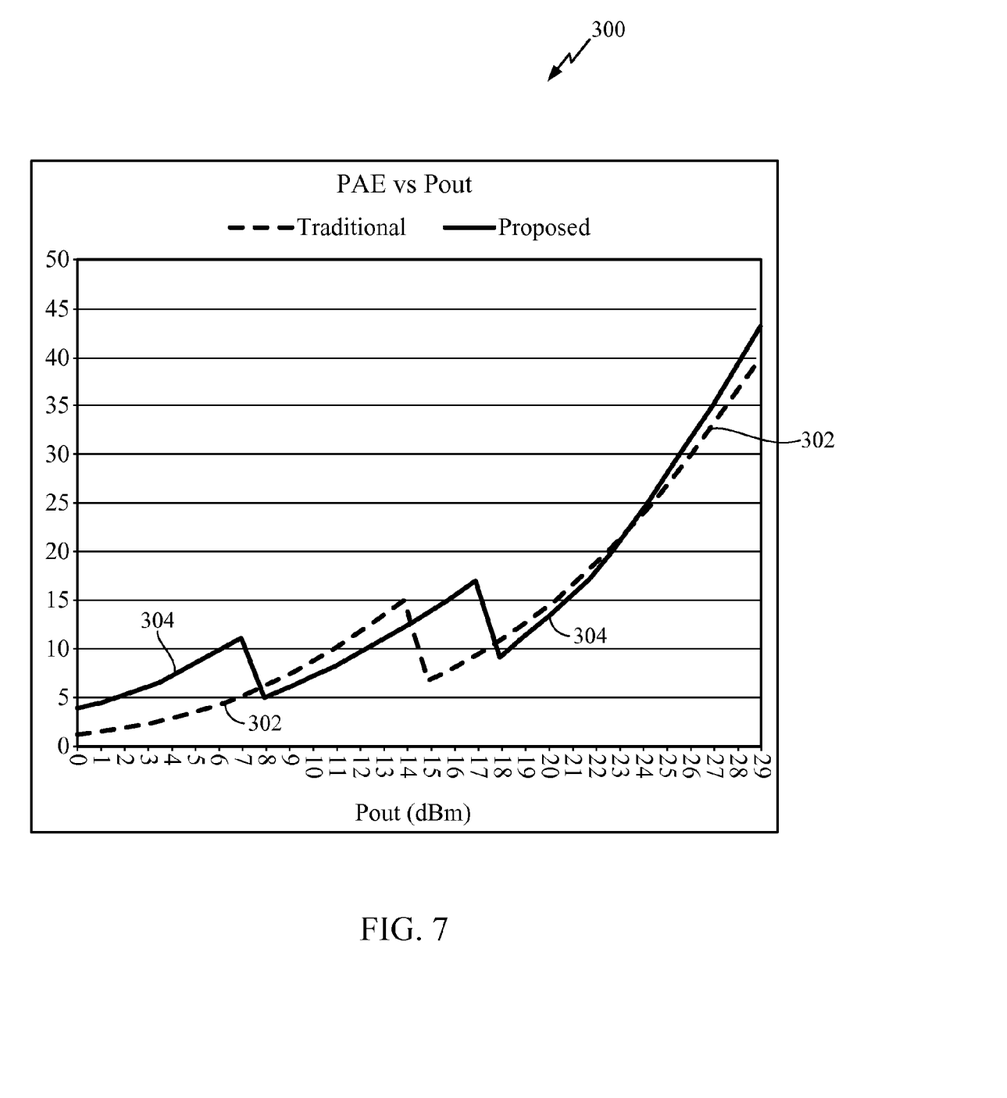
FIG. 7 is a plot depicting power added efficiency in relation to output power for a conventional amplifier module and the power amplifier module of FIG. 3.

FIG. 7 is a plot 400 depicting power added efficiency (PAE) relative to output power (Pout) for a conventional amplifier module and an amplifier module in accordance with an exemplary embodiment of the present invention. More specifically, waveform 402 depicts PAE versus Pout for a conventional amplifier module and waveform 404 depicts PAE versus Pout for an amplifier module in accordance with an exemplary embodiment of the present invention (e.g., amplifier module 200). As shown in plot 400, PAE in low-power mode (i.e., from 0 dBm to approximately 7 dBm) is higher for waveform 404 due to the optimized device size in a separate path (i.e., the low-power mode transmit path). Further, Pout is higher for waveform 404 in medium-power mode (i.e., from approximately 7 dBm to 17 dBm) due to the optimized device size of a driver amplifier (e.g., driver amplifier 204). In addition, in high-power mode (i.e., from approximately 17 dBm to 29 dBm), waveform 404 has a larger PAE due to less insertion loss from a split switch configuration (i.e., switches S11 and S12 of module 200 of FIG. 3 compared to switch S3 of module 100 of FIG. 2).

Figure 8:
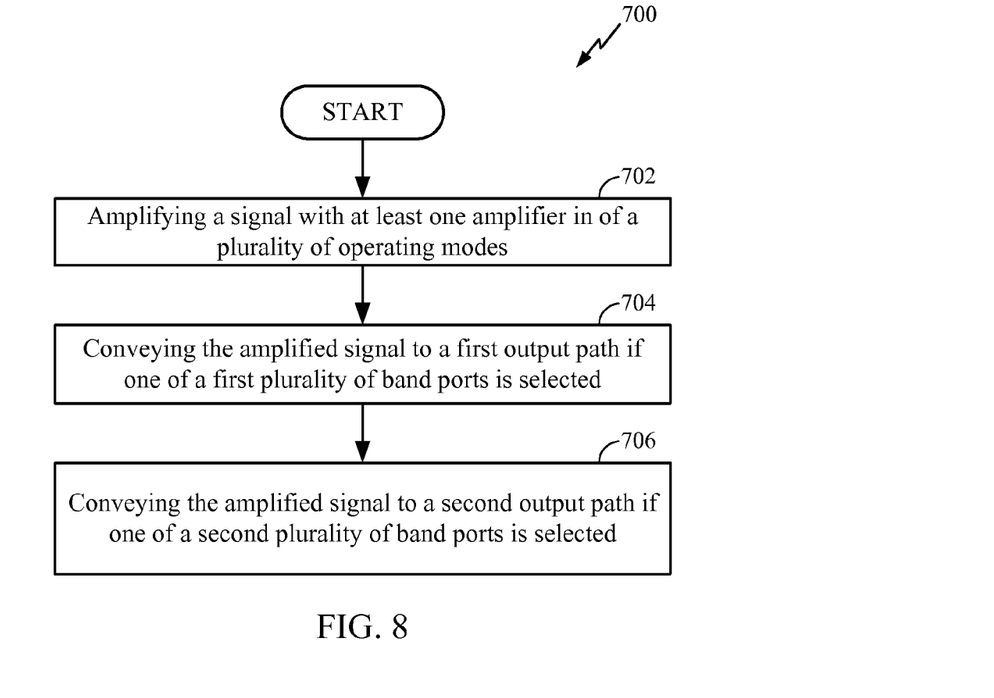
FIG. 8 is a flowchart illustrating a method, according to an exemplary embodiment of the present invention.

FIG. 8 is a flowchart illustrating a method 700, in accordance with one or more exemplary embodiments. Method 700 may include amplifying a signal with at least one amplifier in of a plurality of operating modes (depicted by numeral 702). Method 700 may also include conveying the amplified signal to a first output path if one of a first plurality of band ports is selected (depicted by numeral 704). In addition, method 700 may include conveying the amplified signal to a second output path if one of a second plurality of band ports is selected (depicted by numeral 706).

Figure 9:
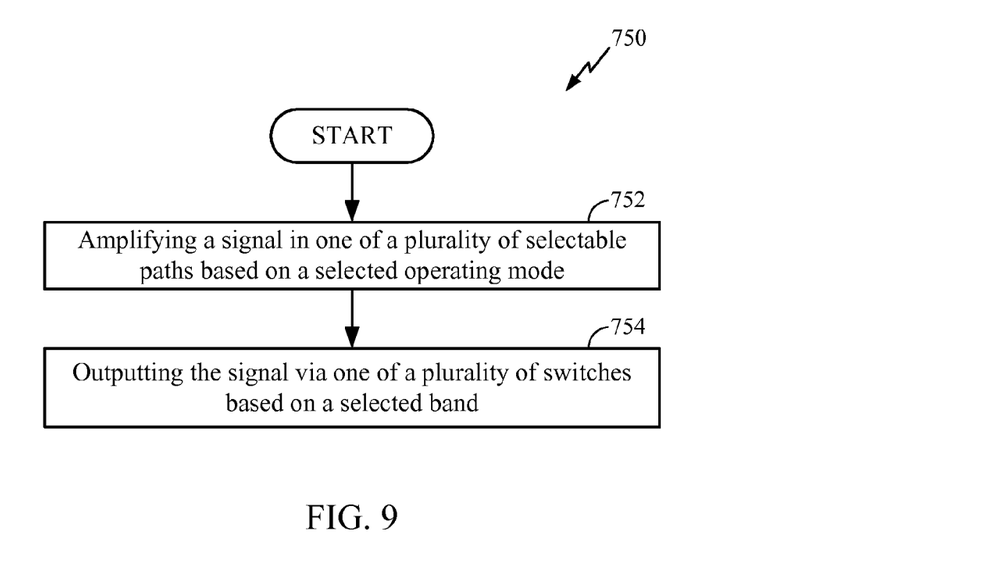
FIG. 9 is a flowchart illustrating another method, according to an exemplary embodiment of the present invention.

FIG. 9 is a flowchart illustrating another method 750, in accordance with one or more exemplary embodiments. Method 750 may include amplifying a signal in one of a plurality of selectable paths based on a selected operating mode (depicted by numeral 752). Method 750 may also include outputting the signal via one of a plurality of switches based on a selected band (depicted by numeral 754).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. An amplifier module, comprising:
   a transmit path including a first amplifier and a second amplifier; and
   a transformer coupled between the first amplifier and the second amplifier and switchably configured to double-endedly couple the first amplifier in series with the second amplifier in a first mode and to single-endedly couple the first amplifier to bypass the second amplifier through at least a portion of the transformer in a second mode.

2. The amplifier module of claim 1, further comprising another transmit path including a third amplifier for operating in a third mode.

3. The amplifier module of claim 2, further comprising:
   a first switch to couple either the transmit path or the another transmit path to one of a first band port and a second band port; and
   a second switch to couple either the transmit path or the another transmit path to one of a third band port and a fourth band port.

4. The amplifier module of claim 2, the first mode comprising a high-power mode, the second mode comprising a medium-power mode, and the third mode comprising a low-power mode.

5. The amplifier module of claim 1, the transmit path including:
   a second transformer to receive a single-ended input signal and to convey a double-ended output signal to the first amplifier.

6. The amplifier module of claim 5, further including a third transformer to receive a double-ended input signal conveyed from the second amplifier and to convey a single-ended signal to an output.

7. The amplifier module of claim 1, the transformer to receive an output signal and switchably configured to either convey a double-ended signal to the second amplifier in the first mode or to convey a single-ended signal to bypass the second amplifier in the second mode.

8. The amplifier module of claim 1, the first mode comprising a high-power mode and the second mode comprising a medium-power mode.

9. The amplifier module of claim 1, further comprising a first switch to couple to an output of either the first amplifier of the second amplifier and to select either a first band or a second band and a second, different switch to couple to an output of either the first amplifier of the second amplifier and to select either a third band or a fourth band.

10. A method, comprising:
    amplifying a signal with at least one amplifier through at least a portion of a transformer in each one of a plurality of operating modes, the transformer double-endedly coupling a first amplifier in series with a second amplifier in a first operating mode and the transformer single-endedly coupling the first amplifier to bypass the second amplifier through at least a portion of the transformer in a second operating mode; and
    conveying the amplified signal to a first output path if one of a first plurality of band ports is selected; and
    conveying the amplified signal to a second output path if one of a second plurality of band ports is selected.

11. The method of claim 10, the amplifying comprising:
    amplifying the signal with the first amplifier and the second amplifier in the first operating mode;
    amplifying the signal with the first amplifier in the second operating mode; and
    amplifying the signal with a third amplifier in a third operating mode.

12. The method of claim 11, further comprising switchably configuring the transformer to convey a signal output from the first amplifier to the second amplifier in the first operating mode.

13. The method of claim 11, further comprising switchably configuring the transformer to convey a signal output from the first amplifier to one of the first output path and the second output path in the second operating mode.

14. The method of claim 10, the amplifying comprising amplifying the signal in one of a high-power mode, a medium power mode, and a low-power mode.

15. The method of claim 10, the amplifying comprising:
    converting a single-ended signal to a double-ended signal at the transformer; and
    converting an amplified double-ended signal to a single-ended signal at another transformer.

16. The method of claim 10, further comprising outputting the signal via one of a plurality of switches based on a selected band.

17. The method of claim 16, the outputting comprising one of outputting the signal via a first switch if one of a first band and a second band is selected and outputting the signal via a second switch if one of a third band and a fourth band is selected.

18. The method of claim 10, further comprising providing impedance matching from an output of a driver amplifier to an input of a power amplifier in a high-power mode.

19. The method of claim 10, tuning a capacitor to provide at least one of interstage matching and output matching for the at least one amplifier.

20. A device, comprising:
  means for amplifying a signal with at least one amplifier through at least a portion of a transformer in each of a plurality of operating modes, the transformer double-endedly coupling a first amplifier in series with a second amplifier in a first operating mode and the transformer single-endedly coupling the first amplifier to bypass the second amplifier through at least a portion of the transformer in a second operating mode; and
  means for conveying the amplified signal to a first output path if one of a first plurality of band ports is selected; and
  means for conveying the amplified signal to a second output path if one of a second plurality of band ports is selected.

* * * * *